(12) United States Patent
Yu et al.

(10) Patent No.: US 8,493,127 B1
(45) Date of Patent: Jul. 23, 2013

(54) SYSTEM AND METHOD FOR LINEARIZATION OF A MIXER

(75) Inventors: Chuanzhao Yu, Phoenix, AZ (US); Haolu Xie, Chandler, AZ (US); Dave Newman, Tempe, AZ (US)

(73) Assignee: Fujitsu Semiconductor Limited, Yokohama-shi (JP)

( * ) Notice: Subject to any disclaimer, the term of this patent is extended or adjusted under 35 U.S.C. 154(b) by 0 days.

(21) Appl. No.: 13/419,150

(22) Filed: Mar. 13, 2012

(51) Int. Cl.
*G06F 7/44* (2006.01)

(52) U.S. Cl.
USPC .......................................... 327/356; 327/359

(58) Field of Classification Search
None
See application file for complete search history.

(56) References Cited

U.S. PATENT DOCUMENTS

| | | | | |
|---|---|---|---|---|
| 4,458,210 A * | 7/1984 | Horl | ............................... | 330/254 |
| 5,548,840 A * | 8/1996 | Heck | .............................. | 455/326 |
| 6,594,504 B1 * | 7/2003 | Grasset | ...................... | 455/550.1 |
| 6,639,447 B2 * | 10/2003 | Manku et al. | ................. | 327/359 |
| 7,280,815 B2 * | 10/2007 | Pellat et al. | .................... | 455/326 |
| 7,514,981 B2 * | 4/2009 | Yang et al. | .................... | 327/359 |
| 7,554,381 B2 * | 6/2009 | Belot et al. | ..................... | 327/359 |
| 7,973,587 B2 * | 7/2011 | Yang et al. | ..................... | 327/359 |
| 8,274,320 B2 * | 9/2012 | Hsu et al. | ....................... | 327/356 |
| 2005/0272398 A1 * | 12/2005 | Chang et al. | .................. | 455/326 |
| 2008/0042726 A1 * | 2/2008 | Belot et al. | ..................... | 327/356 |
| 2010/0019304 A1 * | 1/2010 | Minami et al. | ................ | 257/314 |

OTHER PUBLICATIONS

Wenjun Sheng et al.; Wenjun Sheng; A 3-V, 0.35-um CMOS Bluetooth Receiver IC; IEEE Journal of Solid-State Circuits; Jan. 2003; pp. 30-42, vol. 38, No. 1, 2003.

* cited by examiner

*Primary Examiner* — Tuan T Lam
(74) *Attorney, Agent, or Firm* — Baker Botts L.L.P.

(57) ABSTRACT

A mixer may include a linearization circuit. The linearization circuit may include and operation amplifier, a first pass device, a second pass device, a first feedback resistor, and a second feedback resistor. Each of the first pass device and the second pass device may have a gate terminal, a first non-gate terminal, and a second non-gate terminal and coupled to its gate terminal to an output terminal of the operational amplifier and configured to be coupled at its first non-gate terminal to a high potential source. Each of the first feedback resistor and the second feedback resistor may have a first terminal and a second terminal, the first terminal coupled to the positive input terminal of the operational amplifier and the second terminal coupled to the second non-gate terminal of an associated pass device and the positive polarity of the differential baseband output.

16 Claims, 4 Drawing Sheets

SYSTEM AND METHOD FOR LINEARIZATION OF A MIXER

TECHNICAL FIELD

The present disclosure relates generally to wireless communication and, more particularly, to frequency mixers.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. On the other hand, a receiver is an electronic device which, also usually with the aid of an antenna, receives and processes a wireless electromagnetic signal. In certain instances, a transmitter and receiver may be combined into a single device called a transceiver.

Transmitters in wireless communications devices may often employ mixers to convert a baseband signal at a particular frequency to a radio frequency at another frequency. A frequency mixer is an electrical circuit that creates new frequencies from two signals applied to it. In its most common application, two signals at frequencies $f_1$ and $f_2$ may be applied to a mixer, and the mixer may produce new signals at the sum $f_1+f_2$ and difference $f_1-f_2$ of the original frequencies. Mixers are widely used to shift signals from one frequency range to another, a process known as heterodyning, for convenience in transmission or further signal processing. For example, frequency mixers may be used to modulate a carrier frequency in radio transmitters.

The Gilbert cell, such as that depicted in FIG. 4, is often used in frequency mixers. As shown in FIG. 4, a Gilbert cell may include a transconductance stage 2, a mixer stage 4, and an output stage 6. In operation, a differential input baseband signal $BB_{IN}$ applied to transistors 8a and 8b of transconductance stage 2 may generate a differential baseband signal $BB_{OUT}$ at the output of tranconductance stage 2. A differential mixer frequency signal $V_{LO}$ applied to transistors 10a, 10b, 12a, and 12b of mixer stage 4 as depicted in FIG. 4 may modulate the baseband signal $BB_{OUT}$, thus generating a differential signal $V_{RF}$. The differential signal $V_{RF}$ may be further conditioned by a cascoded common-gate current buffer formed by transistors 14a and 14b of output stage 6, and balun 16 with tuning capacitances 18 and 20 of output stage 6, with the Gilbert cell producing an output signal $V_{out}$.

A direct current (DC) bias present on the output of transconductance stage 2 can be optimized to provide for signal headroom for both transconductance stage 2 and mixer stage 4, with the respective headrooms of transconductance stage 2 and mixer stage 4 trading off. However, the DC bias may vary due to variations in process, voltage, and/or temperature, leading to non-linearity of the Gilbert cell. Also, even-order harmonics generated by transconductance stage 2 may further degrade linearity of the Gilbert cell via direct up-conversion by mixer stage 4 and/or intermodulation.

SUMMARY

A mixer may include a linearization circuit. The linearization circuit may include and operation amplifier, a first pass device, a second pass device, a first feedback resistor, and a second feedback resistor. Each of the first pass device and the second pass device may have a gate terminal, a first non-gate terminal, and a second non-gate terminal and coupled to its gate terminal to an output terminal of the operational amplifier and configured to be coupled at its first non-gate terminal to a high potential source. Each of the first feedback resistor and the second feedback resistor may have a first terminal and a second terminal, the first terminal coupled to the positive input terminal of the operational amplifier and the second terminal coupled to the second non-gate terminal of an associated pass device and the positive polarity of the differential baseband output.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
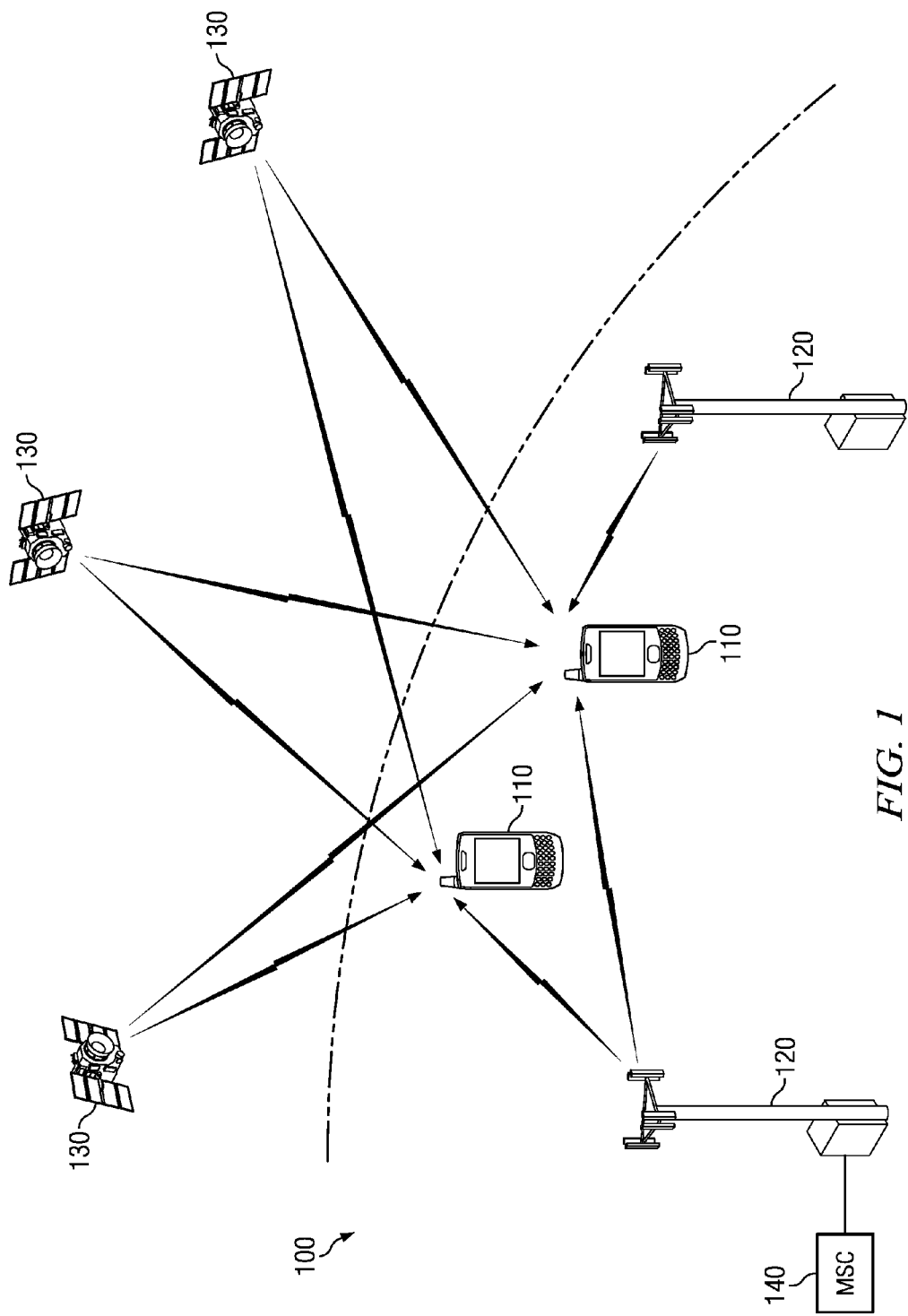
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1 xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
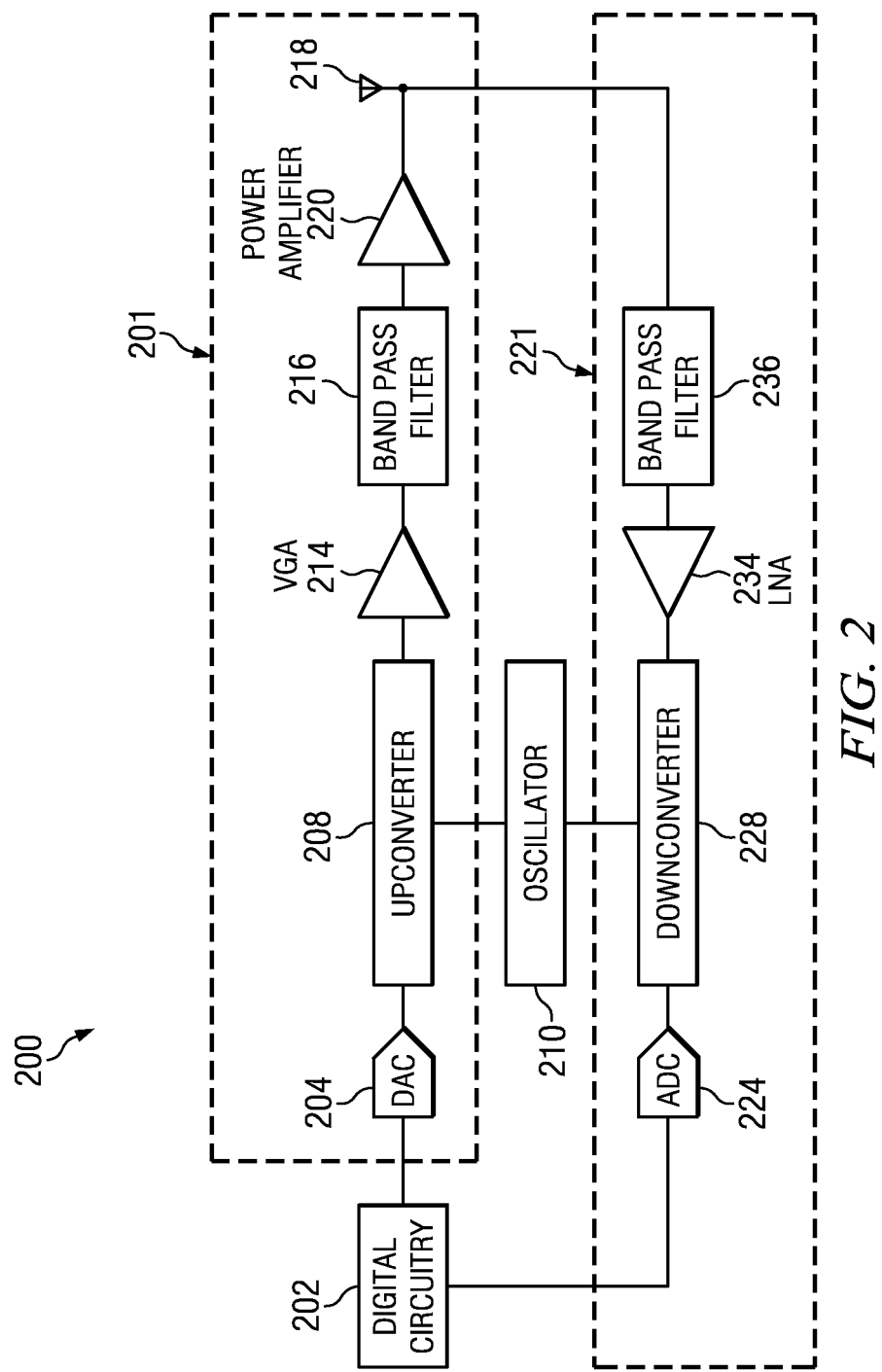
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver. In addition, in certain embodiments transmit path 201 may be considered a transmitter, while receiver path 221 may be considered a receiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal provided by oscillator 210. In some embodiments, upconverter 208 may comprise a mixer (e.g., identical or similar to mixer 300 depicted in FIG. 3). Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator.

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 234 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). In some embodiments, downconverter 228 may comprise a mixer (e.g., identical or similar to mixer 300 depicted in FIG. 3).

Receive path 221 may further include an analog-to-digital converter (ADC) 224 configured to receive the current-mode analog signal from downconverter 228 and convert such analog signal into a digital signal. Such digital signal may then be passed to digital circuitry 202 for processing.

Figure 3:
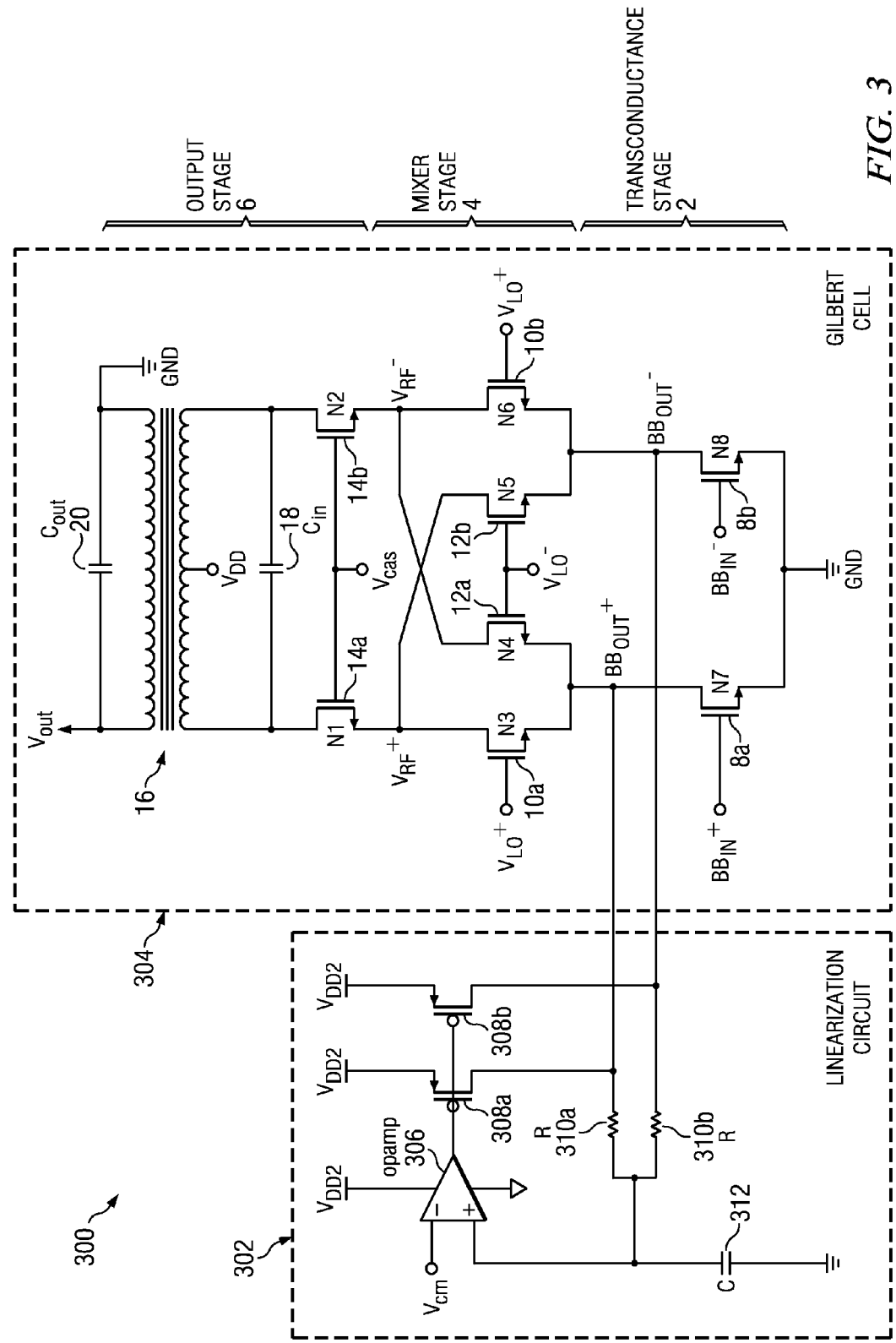
FIG. 3 illustrates a block diagram of an example mixer, in accordance with certain embodiments of the present disclosure.

FIG. 3 illustrates a block diagram of an example mixer 300, in accordance with certain embodiments of the present disclosure. Mixers similar or identical in structure and/or function to mixer 300 may be integral to upconverter 208 and/or downconverter 228. Mixers similar or identical in structure and/or function to mixer 300 may also have other applications.

Figure 4:
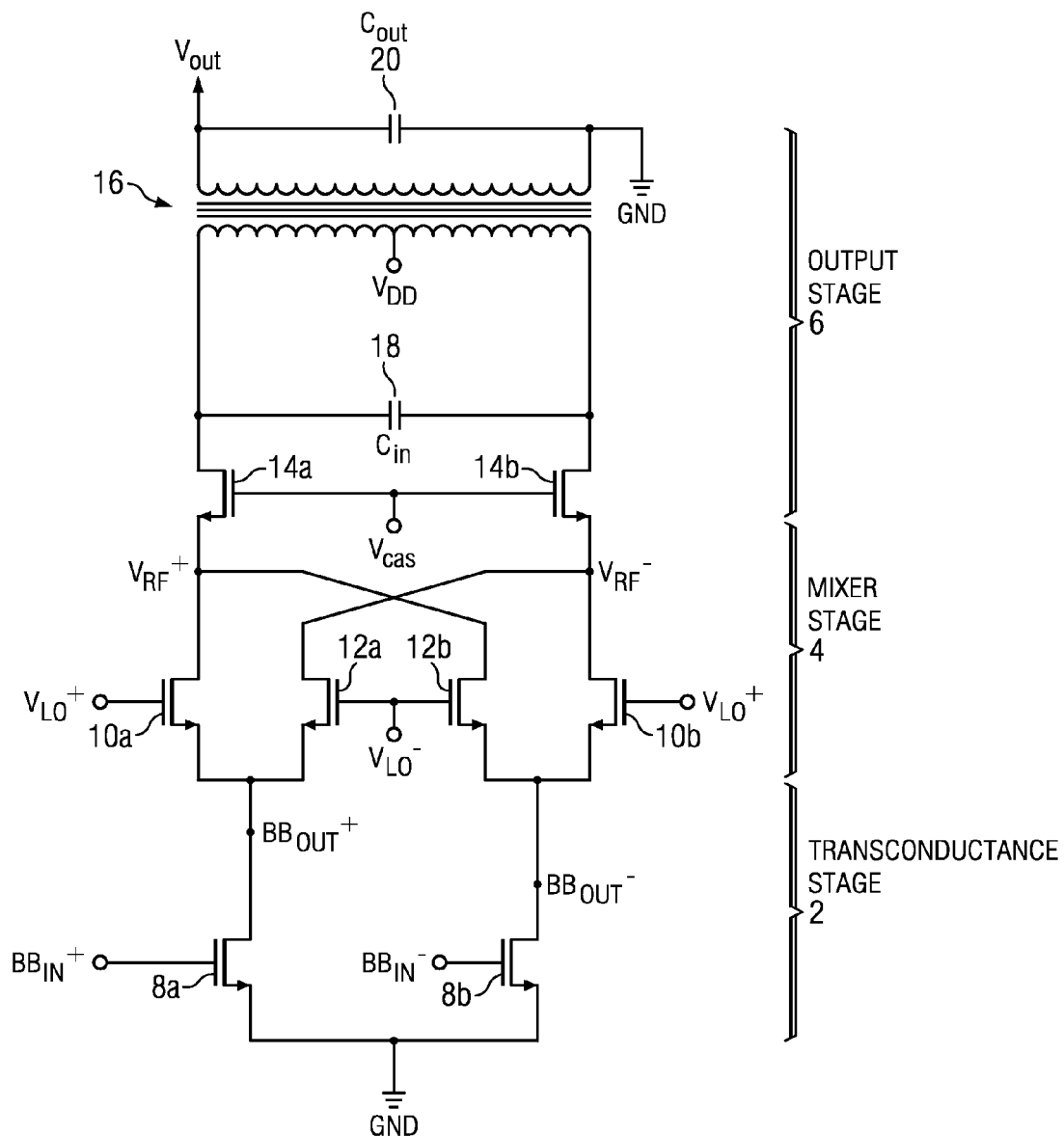
FIG. 4 illustrates an example circuit-level diagram of a Gilbert cell, as is known in the art.

As shown in FIG. 3, mixer 300 may comprise a linearization circuit 302 and a Gilbert cell 304. Gilbert cell 304 may be similar or identical in structure and/or function to the Gilbert cell depicted in FIG. 4 and described above. Linearization circuit 302 may be electrically coupled to Gilbert cell 304 as described in greater detail below and may comprise an operational amplifier (opamp) 306, pass transistors 308a and 308b, feedback resistors 310a, and 310b, and DC bias capacitor 312.

Opamp 306 may comprise any system, device, or apparatus with a differential input and either a single-ended or differential output (a single-ended output is depicted in FIG. 3), which outputs a signal which is a multiple of the voltage difference between the input terminals. Opamp 306 may be biased by a high-potential voltage (e.g., $V_{DD2}$). A common-mode voltage $V_{cm}$ may be applied to the negative (e.g., inverting) input of opamp 306, and the positive (e.g., non-inverting) input of opamp may be coupled to a terminal of DC bias capacitor 312, a terminal of feedback resistor 310a, and a terminal of feedback resistor 310b. Output terminal of opamp 306 may be coupled to gate terminals of pass transistors 308a and 308b.

A pass transistor 308a, 308b may comprise any system, device, or apparatus configured to switch and/or amplify electric signals. Pass transistors 308a and 308b are depicted in the specific embodiment of FIG. 3 as p-type metal-oxide-semiconductor field-effect transistors, but may be implemented as any suitable transistor or switch. Each pass transistors 308a and 308b may be coupled at its gate to the output of opamp 306 and at a first non-gate terminal to a high-potential voltage (e.g., $V_{DD2}$). Each pass transistor 308a and 308b may also be coupled at a second non-gate terminal to a terminal of a respective resistor 310a and 310b, and to a respective terminal of the differential baseband output of transconductance stage 2 of Gilbert cell 304.

Each of feedback resistors 310a and 310b may comprise any electronic component that produces a voltage across its terminals that is proportional to the electric current passing through it in accordance with Ohm's law. As shown in FIG. 3, resistor 310a may be coupled between the positive (e.g., non-inverting) input of opamp 306 and a second non-gate terminal of pass transistor 308a. The terminal of resistor 310a coupled to the second non-gate terminal of pass transistor 308a may also be coupled to a first polarity (e.g., $BB_{OUT}^+$) of the differential baseband output of transconductance stage 2 of Gilbert cell 304. Similarly, resistor 310b may be coupled between the positive (e.g., non-inverting) input of opamp 306 and a second non-gate terminal of pass transistor 308b. The terminal of resistor 310b coupled to the second non-gate terminal of pass transistor 308b may also be coupled to a second polarity (e.g., $BB_{OUT}^-$) of the differential baseband output of transconductance stage 2 of Gilbert cell 304. In some embodiments, resistors 310a and 310b may have approximately the same resistance.

Capacitor 312 may comprise any electronic component including a pair of conductors separated by a dielectric, such that when a potential difference exists across the conductors a static electric field develops in the dielectric that stores energy and produces a mechanical force between the conductors. Capacitor 312 may be coupled between the positive (e.g. non-inverting) input of opamp 306 and a low-potential voltage (e.g. ground voltage), and may serve to control the bandwidth of the common-mode feedback loop of linearization circuit 302 as to render the loop stable. Such bandwidth may be set based on the capacitance C of capacitor 312 and the resistance R of resistors 310a and 310b.

In operation, linearization circuit 302 acts a common-mode feedback loop that sets and maintains a common-mode DC bias voltage of $V_{cm}$ at each polarity of the differential baseband output of transconductance stage 2 of Gilbert cell 304. To illustrate, as the common-mode DC bias voltage at either polarity of the differential baseband output deviates from $V_{cm}$, the variance of the voltage present on the positive (e.g., non-inverting) input of opamp 306 causes the voltage of the output terminal of opamp to vary, such that the current flows through transistors 308a and 308b until such time as the common-mode DC bias voltage of the differential baseband output returns to $V_{cm}$. As a result, a common-mode DC bias voltage can be applied to the differential baseband output that satisfies headroom requirements for linearity of Gilbert mixer 304, and as a result of the common-mode feedback, such common-mode DC voltage may be stable over process, voltage (e.g., variations in bias voltage $V_{DD2}$), and temperature. In addition, resistors 310a and 310b may provide a large impedance with respect to the differential fundamental and odd-order harmonics of Gilbert cell 304, while providing a low impedance for even-order harmonics, permitting linearization circuit 302 to reduce even-order harmonics. In addition, during operation, pass transistors 308a and 308b may extract DC current from the differential baseband output, which may reduce an IR (current multiplied by resistance) drop of the transistors comprising Gilbert cell 304, thus potentially improving headroom in Gilbert cell 304. In addition, a voltage of power supply $V_{DD2}$ may be selected so as to minimize power consumption by components of linearization circuit 302, including pass transistors 308a and 308b (e.g., $V_{DD2}$ may be of a lower-potential than a supply voltage $V_{DD}$ applied to Gilbert cell 304).

Modifications, additions, or omissions may be made to system 100 from the scope of the disclosure. The components of system 100 may be integrated or separated. Moreover, the operations of system 100 may be performed by more, fewer, or other components. As used in this document, "each" refers to each member of a set or each member of a subset of a set.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the invention.

What is claimed is:

1. A mixer, comprising:
    a Gilbert cell comprising:
        a transconductance stage having a differential baseband input and differential baseband output, the differential baseband output having a positive polarity and a negative polarity; and
        a mixer stage configured to modulate a signal present at the differential baseband output;
    a linearization circuit comprising:
        an operational amplifier having an output terminal, a positive input terminal, and a negative input terminal, and configured to receive a common-mode bias voltage at the negative input terminal;
        a first pass device having a gate terminal, a first non-gate terminal, and a second non-gate terminal and coupled to its gate terminal to the output terminal of the operational amplifier and configured to be coupled at its first non-gate terminal to a high potential source;
        a second pass device having a gate terminal, a first non-gate terminal, and a second non-gate terminal and coupled to its gate terminal to the output terminal of the operational amplifier and configured to be coupled at its first non-gate terminal to the high potential source;
        a first feedback resistor having a first terminal and a second terminal, the first terminal coupled to the positive input terminal of the operational amplifier and the second terminal coupled to the second non-gate terminal of the first pass device and the positive polarity of the differential baseband output; and
        a second feedback resistor having a first terminal and a second terminal, the first terminal coupled to the positive input terminal of the operational amplifier and the second terminal coupled to the second non-gate terminal of the second pass device and the negative polarity of the differential baseband output.

2. The mixer of claim 1, wherein any of the first pass device and the second pass device comprises a transistor.

3. The mixer of claim 1, wherein any of the first pass device and the second pass device comprises a p-type metal-oxide-silicon field-effect transistor.

4. The mixer of claim 1, wherein the first resistor and the second resistor have approximately the same resistance.

5. The mixer of claim 1, the linearization circuit further comprising a capacitor having a first terminal and a second terminal, the first terminal coupled to the positive input terminal of the operational amplifier and the second terminal configured to be coupled to a low-potential source.

6. The mixer of claim 5, wherein a capacitance of the capacitor and a resistance of at least one of the first resistor and the second resistor are selected to set a bandwidth for a common-mode feedback loop formed by the linearization circuit.

7. The mixer of claim 1, the Gilbert cell further comprising an output stage comprising a cascoded common-gate current buffer.

8. The mixer of claim 1, the Gilbert cell further comprising an output stage comprising an output balun and at least one tuning capacitor for tuning the output stage.

9. A wireless communication element, comprising:
- a transmit path configured to convert a first digital signal into a first modulated wireless communication signal and transmit the first modulated wireless communication signal; and
- a receive path configured to receive a second modulated wireless communication signal and convert the second wireless communication signal into a second digital signal;
- wherein at least one of the transmit path and the receive path comprises a mixer comprising:
  - a Gilbert cell comprising:
    - a transconductance stage having a differential baseband input and differential baseband output, the differential baseband output having a positive polarity and a negative polarity; and
    - a mixer stage configured to modulate a signal present at the differential baseband output;
  - a linearization circuit comprising:
    - an operational amplifier having an output terminal, a positive input terminal, and a negative input terminal, and configured to receive a common-mode bias voltage at the negative input terminal;
    - a first pass device having a gate terminal, a first non-gate terminal, and a second non-gate terminal and coupled to its gate terminal to the output terminal of the operational amplifier and configured to be coupled at its first non-gate terminal to a high potential source;
    - a second pass device having a gate terminal, a first non-gate terminal, and a second non-gate terminal and coupled to its gate terminal to the output terminal of the operational amplifier and configured to be coupled at its first non-gate terminal to the high potential source;
    - a first feedback resistor having a first terminal and a second terminal, the first terminal coupled to the positive input terminal of the operational amplifier and the second terminal coupled to the second non-gate terminal of the first pass device and the positive polarity of the differential baseband output; and
    - a second feedback resistor having a first terminal and a second terminal, the first terminal coupled to the positive input terminal of the operational amplifier and the second terminal coupled to the second non-gate terminal of the second pass device and the negative polarity of the differential baseband output.

10. The wireless communication element of claim 9, wherein any of the first pass device and the second pass device comprises a transistor.

11. The wireless communication element of claim 9, wherein any of the first pass device and the second pass device comprises a p-type metal-oxide-silicon field-effect transistor.

12. The wireless communication element of claim 9, wherein the first resistor and the second resistor have approximately the same resistance.

13. The wireless communication element of claim 9, the linearization circuit further comprising a capacitor having a first terminal and a second terminal, the first terminal coupled to the positive input terminal of the operational amplifier and the second terminal configured to be coupled to a low-potential source.

14. The wireless communication element of claim 13, wherein a capacitance of the capacitor and a resistance of at least one of the first resistor and the second resistor are selected to set a bandwidth for a common-mode feedback loop formed by the linearization circuit.

15. The wireless communication element of claim 9, the Gilbert cell further comprising an output stage comprising a cascoded common-gate current buffer.

16. The wireless communication element of claim 9, the Gilbert cell further comprising an output stage comprising an output balun and at least one tuning capacitor for tuning the output stage.

* * * * *